United States Patent [19]
Hsu et al.

[11] Patent Number: 6,130,848
[45] Date of Patent: *Oct. 10, 2000

[54] CIRCUIT OF REDUCING TRANSMISSION DELAY FOR SYNCHRONOUS DRAM

[75] Inventors: Peter Kuo-Yuan Hsu, Hsinchu; Jonathan Yen-Ping Chou, Taipei; Tsu Chu Wu, Yi Lan, all of Taiwan

[73] Assignee: Texas Instruments - Acer Incorporated, Hsinchu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 08/988,518

[22] Filed: Dec. 10, 1997

[51] Int. Cl.[7] ........................................................ G11C 7/02
[52] U.S. Cl. ...................... 365/207; 365/203; 365/189.05
[58] Field of Search ..................................... 365/207, 202, 365/203, 189.05

[56] References Cited

U.S. PATENT DOCUMENTS 5,479,374  12/1995  Kobayashi et al. .................. 365/207 X
5,768,214   6/1998  Saitoh et al. ......................... 365/207 X

*Primary Examiner*—Amir Zarabian
*Attorney, Agent, or Firm*—Harness, Dickey & Pierce, P.L.C.

[57] ABSTRACT

A circuit for reducing the transmission delay of the SDRAM by using a cascade-amplifying scheme. The circuit principally encompasses a memory array core for storing data, a main amplifier for initially amplifying the data, an MO-pair receiving amplifier for recognizing and amplifying the data, and an output neighborhood for outputting the data when the data convey a log data path. When the required data output from the memory array core is amplified by the main amplifier, the differential level of the required data will appear at both the far end and the near end of the data path. Therefore, the transmitted data at the far end can be amplified again as long as the differential level is sufficient.

19 Claims, 4 Drawing Sheets

CIRCUIT OF REDUCING TRANSMISSION DELAY FOR SYNCHRONOUS DRAM

BACKGROUND OF THE INVENTION

1. Field of the Invention

The present invention relates to a circuit with improved transmission scheme, and more particularly, to a circuit for reducing the access time of the synchronous DRAM (SDRAM) by using a cascade-amplifying scheme.

2. Description of the Prior Art

Nowadays many kinds of electrical products are invented each day, and these new products usually need high processing speed than before. A key point for upgrading the processing speed is to effectively enhance the access time from data storage, such as decreasing the transmission delay of the DRAM (Dynamic Random Access Memory). Conventionally, the DRAM is a memory that accesses data with asynchronous control signals. However, accurate timings of different signals are needed for controlling the accessing operations.

Synchronous DRAM (SDRAM) is a clock-driven memory that outputs the stored data by using a system clock instead of the additional control signals, which implies that the SDRAM follows a simpler control scheme than the DRAM. In the SDRAM, required data can be indicated when a pulse of the system clock arrives. Then, the required data can be read out from the SDRAiM when the next pulse arrives. Please note that the critical point of the access time bases on the frequency of the system clock but the additional control clocks anymore. In other words, the access time of the SDRAM will be inevitable upgraded when the frequency of the system clock increases. Furthermore, this improvement will be a challenge when memory capacity keeps increasing, which indicates a longer data path for data conveyance.

Referring to FIG. 1, which represents a functional block diagram illustrative of the data path of the general SDRAM. The required data read from a memory array core 10 are amplified by the main amplifier 11, which is enabled by a synchronous enable signal (MAE). The required data then pass a long data path 12 to an output pad neighborhood 13 for outputting. Like conventional DRAM, the memory array core 10 further comprises an array cell 101 storing the required data a sense amplifier 102 enabled by a column selector (YS) sensing the required data, and a precharge and equalize unit 103 for outputting the differential levels of the required data. The long data path 12 is modeled by capacitance loads 122 and 123, and a driver 121 for properly buffering the required data. Finally, the output neighborhood 13 conventionally encompasses a data latch 131 and an output buffer 132, wherein the data latch 131 is enabled by a synchronous latch enable signal (IOLATCH) for storing the required data passing through the long data path 12.

Typically, the capacitance loads 122 and 123 are usually modeled by capacitors with high capacitance values (especially in memory over 64 megabytes), which cause a tremendous transmission delay and become a bottleneck in high speed operation. Although the driver 121 may help to some extent, additional delay and power consumption will appear accordingly. Furthermore, when the chip size keeps increasing, the required data can not prevent themselves from conveying a long data path to the output neighborhood 13. The SDRAM also follows the criteria of the CMOS level (0 or 1) that a data pipeline operation can not start until the levels of the required data achieve stable states. In other words, further waiting time is thus needed to fetch the required data during every cycle. For example, in FIG. 3, which represents a waveform diagram illustrative of while the required data is read from the SDRAM described in the FIG. 1. In the FIG. 3, the waveform of the far end of the main amplifier 11 drops later and weaklier than the near end, which implies the IOLATCH must be postponed until the far end becomes stable. Obviously, the bulk scheme suffers quite a delay transmission. A need has therefore been arisen to disclose a circuit, in which the transmission delay of the SDRAM here can be significantly reduced for achieving the requirement of high operation speed.

SUMMARY OF THE INVENTION

Accordingly, the present invention discloses a circuit for reducing the transmission delay of the SDRAM by using a cascade-amplifying scheme. The circuit principally encompasses a memory array core for storing data, a main amplifier for initially amplifying the data, an MO-pair receiving amplifier for recognizing and amplifying the data, and an output neighborhood for outputting the data when the data convey a long data path. When the required data output from the memory array core and amplified by the main amplifier, the differential level of the required data will appear at both the far end and the near end of the data path. Therefore, the transmitted data at the far end can be amplified again as long as the differential level is sufficient.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
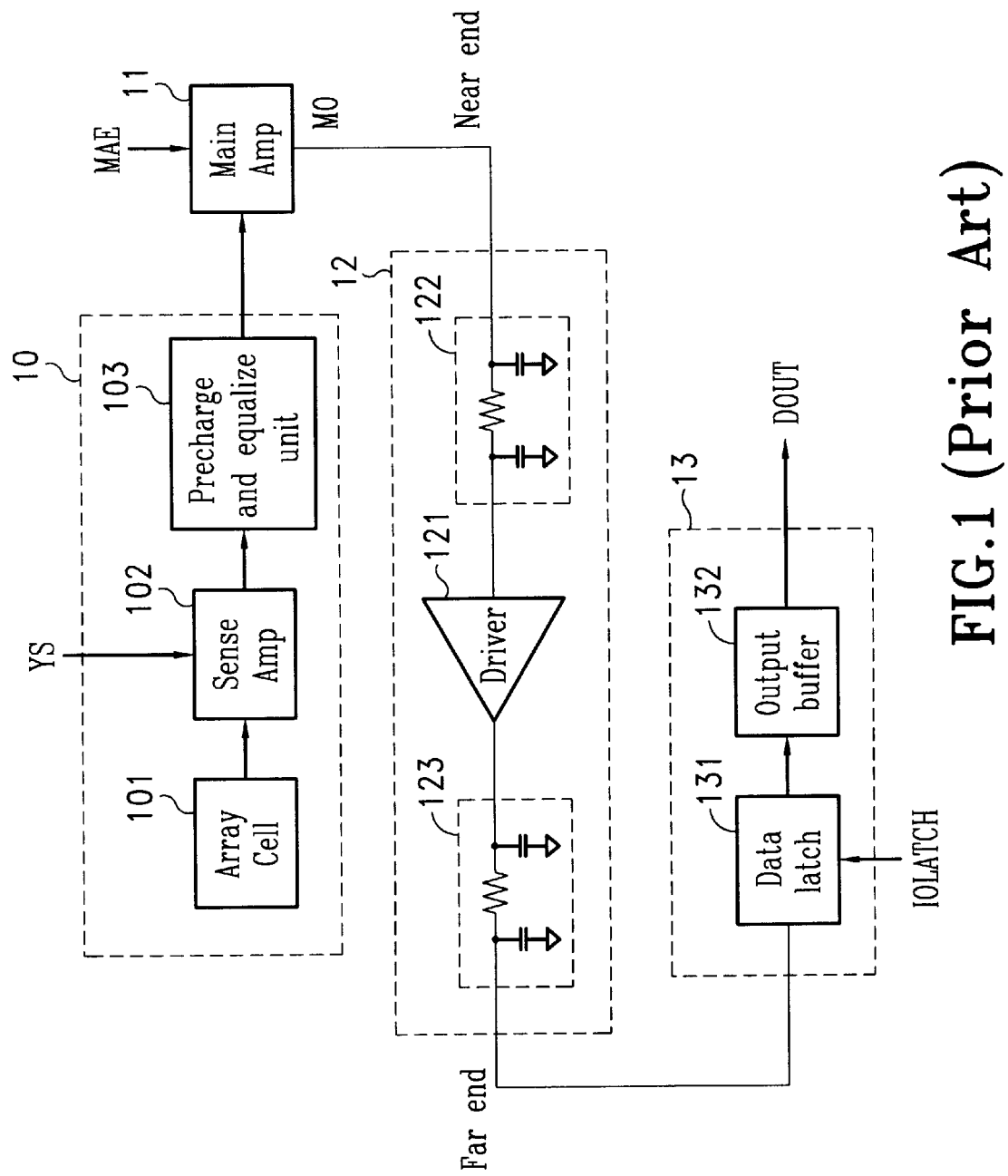
FIG. 1 represents a schematic diagram illustrative of a data path of the conventional SDRAM.
Figure 2:
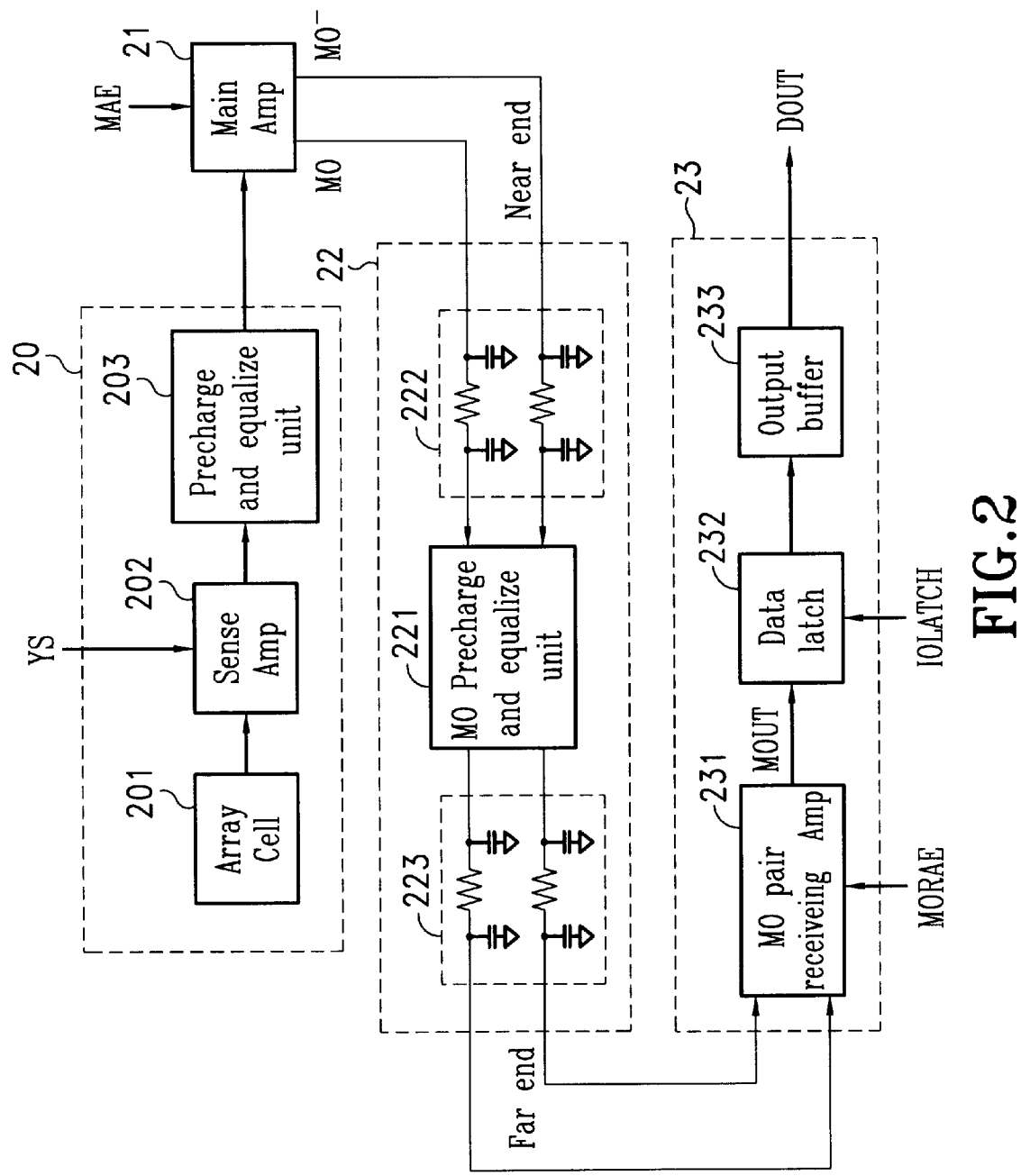
FIG. 2 is a block diagram illustrative of a data path of the SDRAM according to the invention.

Referring to FIG. 2, which shows a functional block diagram, illustrative of the SDRAM data path according to the invention. Similar to the conventional data path, the required data are also read from a memory array core 20, wherein the memory array core 20 also encompasses an array cell 201, a sense amplifier 202 enabled by a column selector (YS), and a precharge and equalize unit 203. The required data still follows the path from a memory array core 20, amplified by the main amplifier 21, and conveyed through a long data path 22 to an output neighborhood 23 for outputting in the FIG. 2. However, the required data can be sensed faster than those in the conventional SDRAM because the differential level of the required data occurs both at the near and far end of the data path. When the main amplifier 21 amplifies the required data, the differential level MO/MO⁻ at the output terminal of the main amplifier 21 will travel a very long data path 22. However, the differential level MO/MO⁻ will be sensed and amplified by a MO-pair receiving amplifier 231 while the differential level is large enough. Then, the required data are routed to a synchronous output latch 232 near an output buffer 233. Please note that differential voltage- or current-sensing amplifiers can be employed as the MO-pair receiving amplifier 231. Obviously, the transmission delay for waiting valid data will be significantly decreased when senses the differential level instead of waiting the full swing of the required data. Moreover, the precharge and equalize unit 203 must equalize the voltage levels of the MO and MO⁻ before next differential level arrives.

Figure 3:
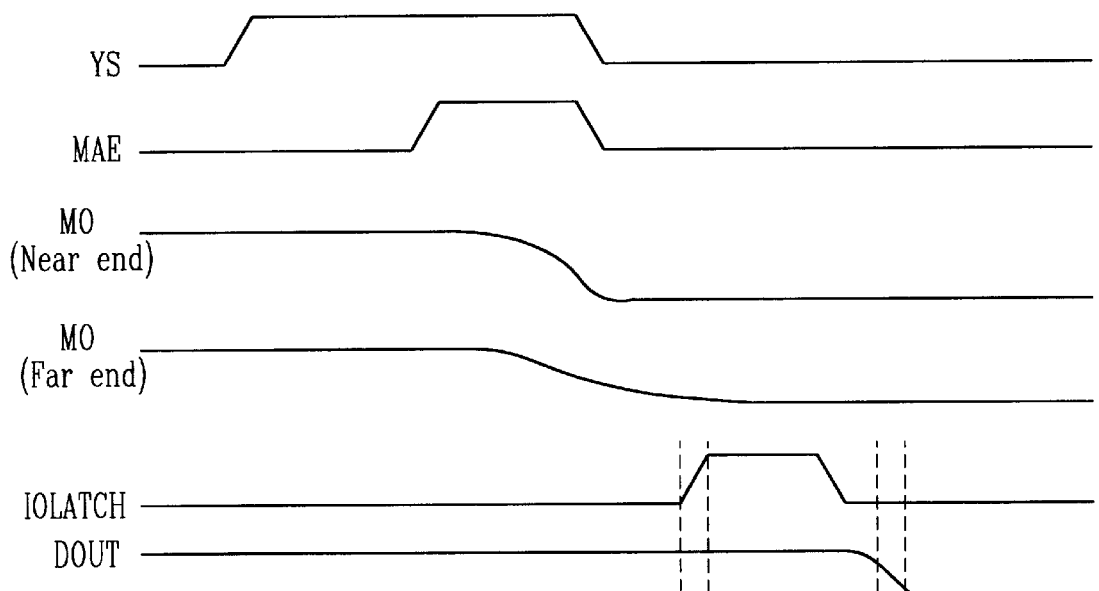
FIG. 3 shows a waveform diagram representing of the data transmission of the conventional SDRAM.
Figure 4:
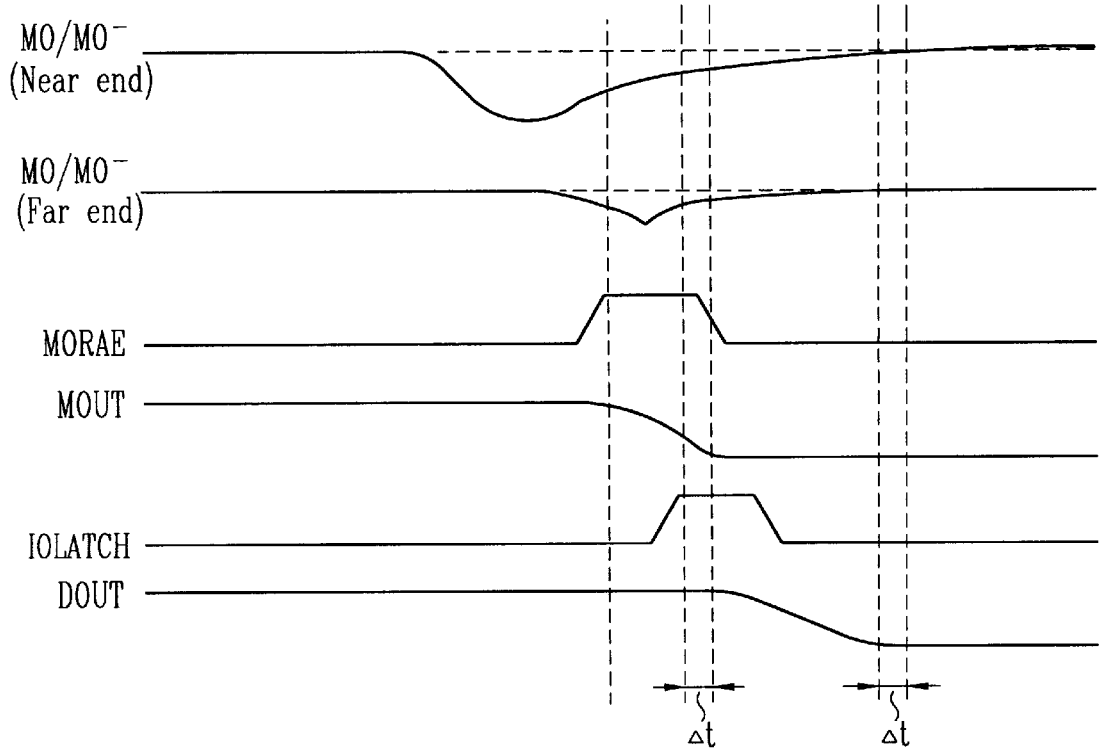
FIG. 4 shows a waveform diagram representing of the data transmission of the SDRAM in the invention.

Referring to FIG. 4, which shows a timing diagram representing of the data transmission of the SDRAM in the invention. In comparison with the FIG. 3, it is obvious that when the differential level of the required data is sufficient, a synchronous signal (MORAE) arrives to enable the MO-pair receiving amplifier 231 to recognize and amplify the required data. The required data then stored in a data latch 232 waiting for a synchronous latch enable signal (IOLATCH) to send out for pipeline processing. Typically, the improved access time is about 1 to 1.5 nano seconds than the conventional SDRAM circuit under 0.35 $\mu$m process. Furthermore, the noise immunity significantly enhances by applying the differential level because there is small cross talk on adjacent data lines, and various options of devices can be integrated by common control signals. The scheme disclosed in the invention is more processindependent than that of process- and voltage-dependent drivers; thus sensitive data output specifications can be easily controlled.

Figure 5:
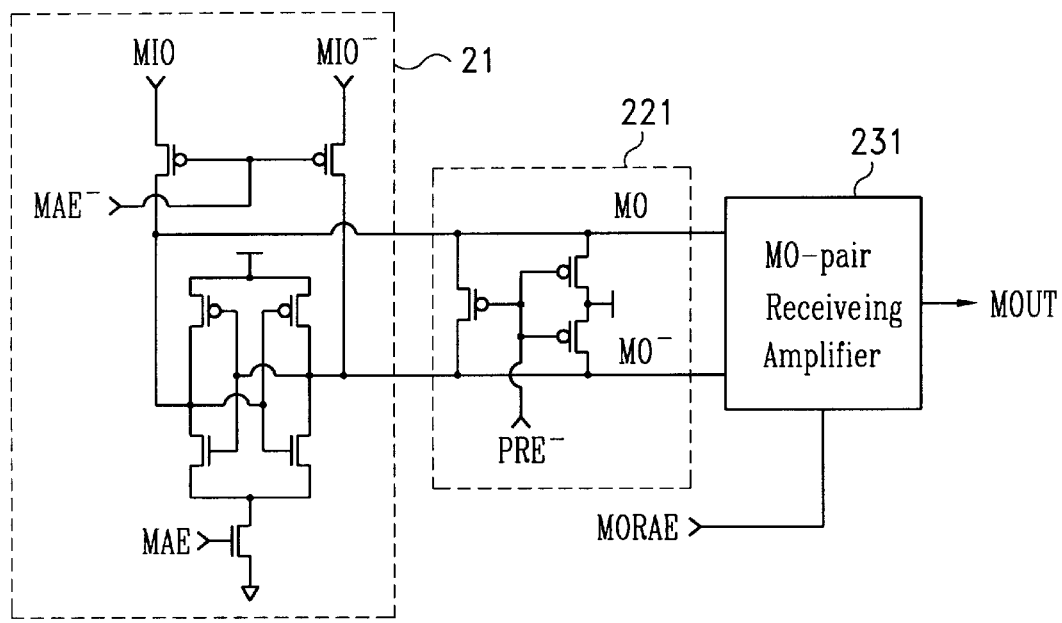
FIG. 5 illustrates a circuit diagram representative of a connection among the main amplifier, the MO precharge and equalize unit, and the MO pair receiver amplifier in the FIG. 2.
Figure 6A:
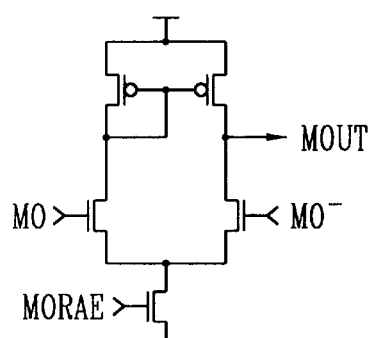
FIG. 6A is an embodiment illustrative of a voltage-sensing amplifier of the MO pair receiver.
Figure 6C:
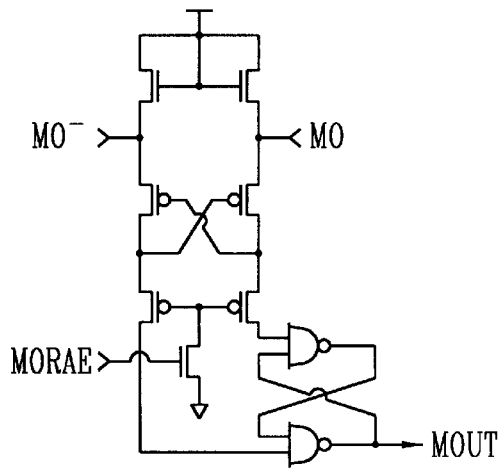
FIG. 6C describes an embodiment illustrative of a current-sensing amplifier of the MO pair receiver.
Figure 6B:
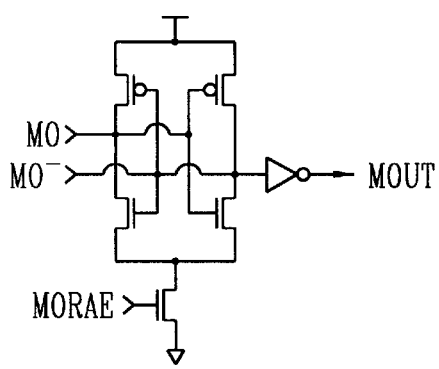
FIG. 6B is another embodiment illustrative of the voltage-sensing amplifier of the MO pair receiver.

The FIG. 5 describes a detail circuit diagram illustrating a connection from the main amplifier 21, through the MO precharge and equalize unit 221, and to the MO-pair receiving amplifier 231. Moreover, the detail circuit diagrams of the MO-pair receiving amplifier 231 are illustrated in the FIGS. 6A to 6C. In the FIG. 5, when the differential level MO/MO⁻ outputs from the precharge and equalize unit 203, the main amplifier 21 can be enabled by the MAE (MAE⁻ is the inverted signal for the MIO equalize). The amplified differential level (on MO/MO⁻) will be sensed and amplified by the MO-pair receiving amplifier 231. Then, the MO precharge and equalize unit 221 is enabled by a precharge enable signal (PRE⁻) to equalize both the levels of the MO/MO⁻ for the next required data. FIGS. 6A and 6B show two embodiments illustrative of voltage sensing amplifiers of the MO-pair receiving amplifier 231. In addition, FIG. 6C describes an embodiment illustrative of a current sensing amplifier of the MO-pair receiving amplifier 231. The above circuits in the FIGS. 6A to 6B can be applied based on applications.

In conclusion, the present invention discloses a circuit for reducing the transmission delay of the SDRAM by using a cascade-amplifying scheme. When the required data output from the main array core are amplified by the main amplifier, the differential level of the required data will appear at both the far end and the near end of the data path. Therefore, the transmitted data at the far end can be amplified again as long as the differential level is sufficient.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A circuit of reducing transmission delay for a synchronous dynamic random access memory (SDRAM), wherein said circuit comprises:

main amplifying means for amplifying a first required signal to generate a pair of second required signals with differential level;

receiving amplifying means for sensing said pair of second required signals with differential level and for generating a third required signal when said differential level is larger enough to be sensed by said receiving amplifying means;

outputting means for outputting said third required signal; and precharging means for equalizing voltage levels of said pair of second required signals when outputting said third required signal before next first required signal arrives said main amplifying means.

2. The circuit according to claim 1, wherein said first required signal is read from a memory array core of said SDRAM.

3. The circuit according to claim 1, wherein said receiving amplifying means comprises voltage-sensing amplifying means for sensing a voltage differential level of said pair of second required signals.

4. The circuit according to claim 1, wherein said receiving amplifying means comprises current-sensing amplifying means for sensing a current differential level of said pair of second required signals.

5. The circuit according to claim 1, wherein said precharging means is enabled after said third required signal is generated.

6. The circuit according to claim 5, wherein said outputting means comprises a data latch for storing said third required signal.

7. The circuit according to claim 6, wherein said data latch responses to an output enabling signal for outputting said third required signal.

8. The circuit according to claim 1, wherein said outputting means comprises an amplifier for amplifying said third required signal.

9. A circuit of reducing transmission delay for a synchronous dynamic random access memory (SDRAM), wherein said circuit comprises:

memory array core means for providing a first required signal;

main amplifying means for amplifying said first required signal to generate a pair of second required signals with differential level;

receiving amplifying means for sensing said differential level of said pair of second required signals and for generating a third required signal when said differential level is larger enough to be sensed by said receiving amplifying means;

outputting means for outputting said third required signal; and precharging means for equalizing voltage levels of said pair of second required signals when outputting said third required signal before next first required signal arrives said main amplifying means.

10. The circuit according to claim 9, wherein said receiving amplifying means comprises voltage-sensing amplifying means for sensing a voltage differential level of said pair of second required signals.

11. The circuit according to claim 9, wherein said receiving amplifying means comprises current-sensing amplifying means for sensing a current differential level of said pair of second required signals.

12. The circuit according to claim 9, wherein said precharging means is enabled after said third required signal is generated.

13. The circuit according to claim 9, wherein said outputting means comprises a data latch for storing said third required signal.

14. The circuit according to claim 13, wherein said data latch responses to an output enabling signal for outputting said third required signal.

15. The circuit according to claim 9, wherein said outputting means comprises an amplifier for amplifying said third required signal.

16. A method of reducing transmission delay for synchronous dynamic random access memory (SDRAM), wherein said method comprises the steps of:

forming a first required signal;

amplifying said first required signal to generate a pair of second required signals with differential levels;

sensing said differential level of said pair of second required signals when said differential level is large enough to be sensed to generate a third required signal;

outputting said third required signal in response to an output enabling signal; and precharging said pair of second required signal to equalize said differential level when outputting said third required signal before next first required signal be amplified.

17. The method according to claim 16, wherein said first required signal is read from a memory array core means.

18. The method according to claim 16, wherein said differential level is sensed by voltage-sensing amplifier.

19. The method according to claim 16, wherein said differential level is sensed by current-sensing amplifier.

* * * * *